United States Patent
Wong

(10) Patent No.: US 9,418,920 B2
(45) Date of Patent: Aug. 16, 2016

(54) INTEGRATED CIRCUIT (IC) PACKAGE WITH THICK DIE PAD FUNCTIONING AS A HEAT SINK

(71) Applicant: STMICROELECTRONICS PTE LTD, Singapore (SG)

(72) Inventor: Wing Shenq Wong, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 10 days.

(21) Appl. No.: 14/589,094

(22) Filed: Jan. 5, 2015

(65) Prior Publication Data

US 2016/0197030 A1 Jul. 7, 2016

(51) Int. Cl.
| | |
|---|---|
| H01L 23/495 | (2006.01) |
| H01L 23/48 | (2006.01) |
| H01L 23/52 | (2006.01) |
| H01L 29/40 | (2006.01) |
| H01L 23/29 | (2006.01) |
| H01L 23/31 | (2006.01) |
| H01L 21/48 | (2006.01) |
| H01L 21/56 | (2006.01) |
| H01L 23/00 | (2006.01) |

(52) U.S. Cl.
CPC ...... *H01L 23/49568* (2013.01); *H01L 21/4825* (2013.01); *H01L 21/565* (2013.01); *H01L 23/3135* (2013.01); *H01L 23/4952* (2013.01); *H01L 23/49513* (2013.01); *H01L 23/49541* (2013.01); *H01L 23/49582* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 2224/32245* (2013.01); *H01L 2224/48106* (2013.01); *H01L 2224/48247* (2013.01); *H01L 2224/73265* (2013.01); *H01L 2224/838* (2013.01); *H01L 2224/92247* (2013.01); *H01L 2924/01028* (2013.01); *H01L 2924/01046* (2013.01); *H01L 2924/01079* (2013.01); *H01L 2924/14* (2013.01); *H01L 2924/17738* (2013.01); *H01L 2924/17763* (2013.01)

(58) Field of Classification Search
CPC .............. H01L 23/49568; H01L 23/3135; H01L 23/49541; H01L 23/49513; H01L 24/92; H01L 24/32; H01L 21/4825; H01L 23/49582; H01L 23/4952; H01L 24/73; H01L 21/565; H01L 24/49; H01L 24/83; H01L 24/85; H01L 2224/73265; H01L 2224/48247; H01L 2224/32245; H01L 2924/17763; H01L 2224/838; H01L 2924/17738
USPC .......... 257/666, 674, 675, 676, 786, 787, 790
See application file for complete search history.

(56) References Cited

U.S. PATENT DOCUMENTS

| | | | |
|---|---|---|---|
| 6,211,462 B1 * | 4/2001 | Carter, Jr. ........... | H01L 23/3107 174/522 |
| 6,239,487 B1 * | 5/2001 | Park .................... | H01L 23/4334 257/666 |
| 6,501,156 B1 | 12/2002 | Nakanishi et al. | |

(Continued)

*Primary Examiner* — A. Sefer
*Assistant Examiner* — Dilinh Nguyen
(74) *Attorney, Agent, or Firm* — Allen, Dyer, Doppelt, Milbrath & Gilchrist, P.A.

(57) ABSTRACT

An integrated circuit (IC) package includes a die pad and an IC die secured on the die pad. The IC die had outer edges aligned with outer edges of the die pad. An encapsulating material body surrounds the die pad and IC die. Leads extend outwardly from the encapsulating material body and are coupled to the IC die. Each lead has an upper surface coplanar with an upper surface of the IC die. The die pad has a lower surface exposed through the encapsulating material body, and has a thickness greater than a thickness of each of the plurality of leads.

24 Claims, 3 Drawing Sheets

(56) References Cited

U.S. PATENT DOCUMENTS

| | | | |
|---|---|---|---|
| 7,247,934 B2 * | 7/2007 | Pu | H01L 24/97 257/666 |
| 2014/0191383 A1 | 7/2014 | Yao et al. | |
| 2015/0076675 A1 * | 3/2015 | Real | H01L 23/49548 257/676 |

* cited by examiner

INTEGRATED CIRCUIT (IC) PACKAGE WITH THICK DIE PAD FUNCTIONING AS A HEAT SINK

FIELD OF THE INVENTION

The present invention relates to the field of semiconductor packaging, and more particularly, to an IC package with a die pad that functions as a heat sink, and related methods.

BACKGROUND OF THE INVENTION

Integrated circuit (IC) packages are assembled using lead frames. Each lead frame may include a plurality of leads, tie bars, and a die pad. The die pad is centrally located on the lead frame and provides a surface on which an IC die may be mounted. For power devices, the die pad serves as a heat sink wherein a lower surface of the die pad may be exposed to dissipate heat from the IC die.

There are different configurations of lead frames for the many different sizes of IC dies. A mono-thickness lead frame has the same thickness throughout. A dual-gauge lead frame uses materials having two different thicknesses. The thicker section becomes the die pad and the thinner section becomes the leads. A bi-component lead frame involves forming the lead frame and die pad separately, and then attaching the two together with a mechanical joint, such as with riveting or welding. The die pad is much thicker than the leads.

A thicker die pad is able to dissipate more heat away from the IC die. However, if a thickness of the die pad becomes too thick, it may be difficult to produce the end portions of the inner leads. A fine pitch is typically needed for the end portions of the inner leads, and this becomes difficult to produce with high precision when the die pad is much thicker than the leads.

One approach for a lead frame with a thicker die pad is disclosed in U.S. Pat. No. 6,501,156. The lead frame includes a die pad with a die pad main portion having a large thickness and a die pad peripheral portion having an intermediate thickness smaller than that of the die pad main portion. At least one support lead is connected to the die pad, and at least two first inner leads having a small thickness smaller than that of the die pad peripheral portion are arranged such that end portions thereof are opposed to the die pad peripheral portion.

Another approach for a lead frame with a thicker die pad is disclosed in U.S. patent application no. 2014/0191383. A packaged power device includes two lead frames. A first lead frame is a power frame with a thick die pad, and an IC die is attached to the thick die pad. The second lead frame has thin lead fingers, wherein a thickness of the second lead frame is less than a thickness of the power frame. One end of each of the thin lead fingers is attached to a bonding pad on an active surface of the power semiconductor die with a conductive adhesive. A molding compound covers the power frame, the lead frame, and the power semiconductor die.

Even in view of the above approaches for providing a lead frame with a thicker die pad, a problem with die pad delamination is still an issue. Delamination in IC packages is mainly caused by a coefficient of thermal expansion mismatch between the interfaces of two materials within the package. Die pad delamination is the separation between the IC die and the die pad on the lead frame. Die pad delamination reduces the total area of the IC die that is attached to the die pad, and is known to increase the thermal resistance of the IC package. This could lead to early thermal shutdown of a device which uses an exposed die pad to dissipate heat.

SUMMARY OF THE INVENTION

An integrated circuit (IC) package may comprise a die pad, and an IC die secured on the die pad. The IC die may have outer edges aligned with outer edges of the die pad. An encapsulating material body may surround the die pad and IC die. A plurality of leads may extend outwardly from the encapsulating material body and may be coupled to the IC die. Each lead may have an upper surface coplanar with an upper surface of the IC die. The die pad may have a lower surface exposed through the encapsulating material body, and have a thickness greater than a thickness of each of the plurality of leads.

With the outer edges of the IC die aligned with the outer edges of the die pad, this advantageously reduces the chance of delamination between the IC die and die pad. A lead frame includes the plurality of leads, and lead frame costs may be reduced with the die pad being formed separate from the lead frame. Another advantage of forming the die pad separate from the lead frame is that a desired thickness of the die pad may be more easily obtained while allowing end portions of the leads to be easily formed.

The thickness of the die pad may be at least two times a thickness of each of the plurality of leads. Each lead may also have a lower surface coplanar with a lower surface of the die pad.

The IC die may comprise a plurality of bond pads. Respective bond wire may couple each of the plurality of leads to a corresponding bond pad of the plurality of bond pads.

The encapsulating material body may comprise an upper body portion comprising a first encapsulating material, and a lower body portion comprising a second encapsulating material different than the first encapsulating material. A quality of the first encapsulating material may be greater than a quality of the second encapsulating material. The risk of wire sweep for the bond wires coupled between the bond pads and the leads is advantageously reduced by using the first encapsulating material with a greater quality. An advantage of using the second encapsulating material with the lower quality is that production costs may be further reduced.

A plating material may be on at least one of external surfaces and internal surfaces of each lead of the plurality of leads. A plating material may also be on the exposed lower surface of the die pad. The plating material may comprise nickel, palladium and gold, for example.

Another aspect is directed to a method for making an integrated circuit (IC) package as described above. The method may comprise securing an IC die on a die pad, with the IC die having outer edges aligned with outer edges of the die pad. A plurality of leads may be coupled to the IC die, with each lead having an upper surface coplanar with an upper surface of the IC die. The method may further comprise forming an encapsulating material body surrounding the die pad and IC die, with the plurality of leads extending outwardly from the encapsulating material body. The die pad may have a lower surface exposed through the encapsulating material body, and have a thickness greater than a thickness of each of the plurality of leads.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
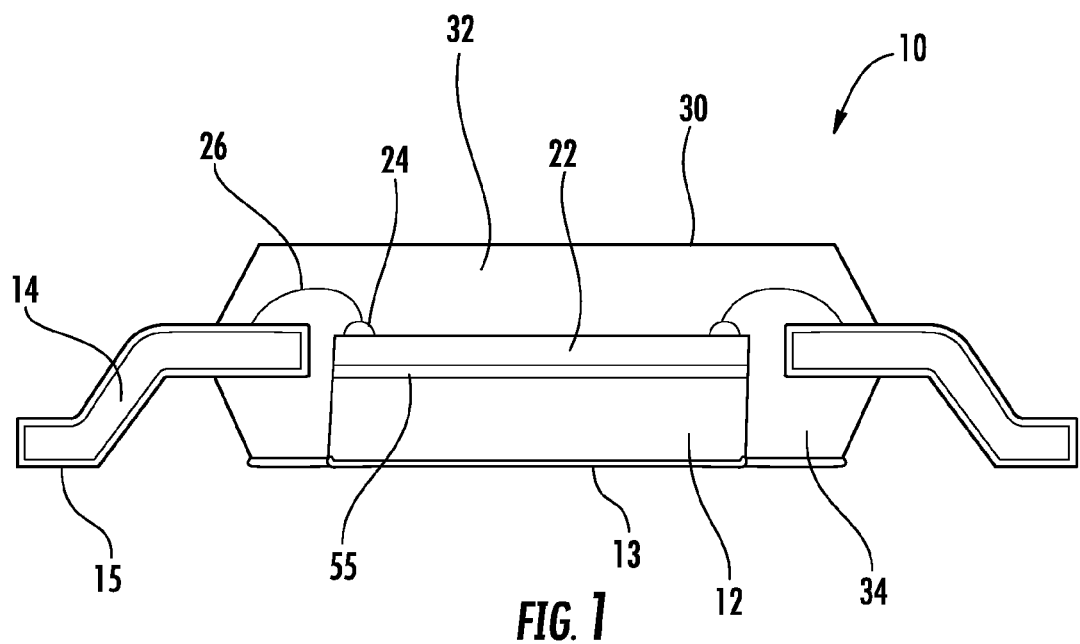
FIG. 1 is a cross-sectional view of an integrated circuit (IC) package with a thick die pad in accordance with the present invention.

Referring initially to FIG. 1, an integrated circuit (IC) package 10 includes a die pad 12, and an IC die 22 secured on the die pad. The IC die 22 has outer edges aligned with outer edges of the die pad 10. An encapsulating material body 30 surrounds the die pad 12 and IC die 22. A plurality of leads 14 extend outwardly from the encapsulating material body 30 and are coupled to the IC die 22. Each lead 14 has an upper surface coplanar with an upper surface of the IC die 22. The die pad 12 has a lower surface exposed through the encapsulating material body 30, and has a thickness greater than a thickness of each of the plurality of leads.

With the outer edges of the IC die 22 being aligned with the outer edges of the die pad 10, this advantageously reduces the chance of delamination between the IC die and die pad. As will be explained in greater detail below, the die pad 12 is formed separate from the lead frame (i.e., leads 14).

An advantage of forming the die pad 12 separate from the leads 14 is that a desired thickness of the die pad may be more easily obtained. This is particularly helpful when the IC package 10 is a power device, where the die pad 12 serves as a heat sink. Depending on the amount of heat to be dissipated by the IC package 10, the die pad 12 is selected to have the desired thickness. Another advantage of forming the die pad 12 separate from the leads 14 is that production costs may be reduced.

For example, the thickness of the die pad 12 may be at least two times a thickness of each of the plurality of leads 14. Each lead 14 may also have a lower surface coplanar with a lower surface of the die pad 12, as shown in the illustrated embodiment.

The IC die 22 includes a plurality of bond pads 24. Respective bond wire 26 is coupled between each of the leads 14 to a corresponding bond pad 24 of the plurality of bond pads. An adhesive layer 55 is used to secure the IC die 22 to the die pad 12.

The encapsulating material body 30 may comprise an upper body portion 32 comprising a first encapsulating material, and a lower body portion 34 comprising a second encapsulating material different than the first encapsulating material. A quality of the first encapsulating material is greater than a quality of the second encapsulating material. The risk of wire sweep for the bond wires 26 coupled between the bond pads 24 and the leads 14 is advantageously reduced by using the first encapsulating material with a better quality of encapsulating material. An advantage of using the second encapsulating material with a lower quality of encapsulating material is that production costs may be further reduced. Alternatively, the first and second encapsulating material may comprise the same encapsulating material.

A plating material 15 is on external and internal surfaces of each lead 14 of the plurality of leads. A plating material 13 may also be on the exposed lower surface of the die pad 12. The plating material may comprise nickel, palladium and gold, for example. In other embodiments, the leads 14 may have the plating material 15 on the external surfaces of the leads 14 (i.e., lead portions extending from the encapsulating material body 30), and not on the internal surfaces of the leads (i.e., lead portions within the encapsulating material body 30).

Figure 2:
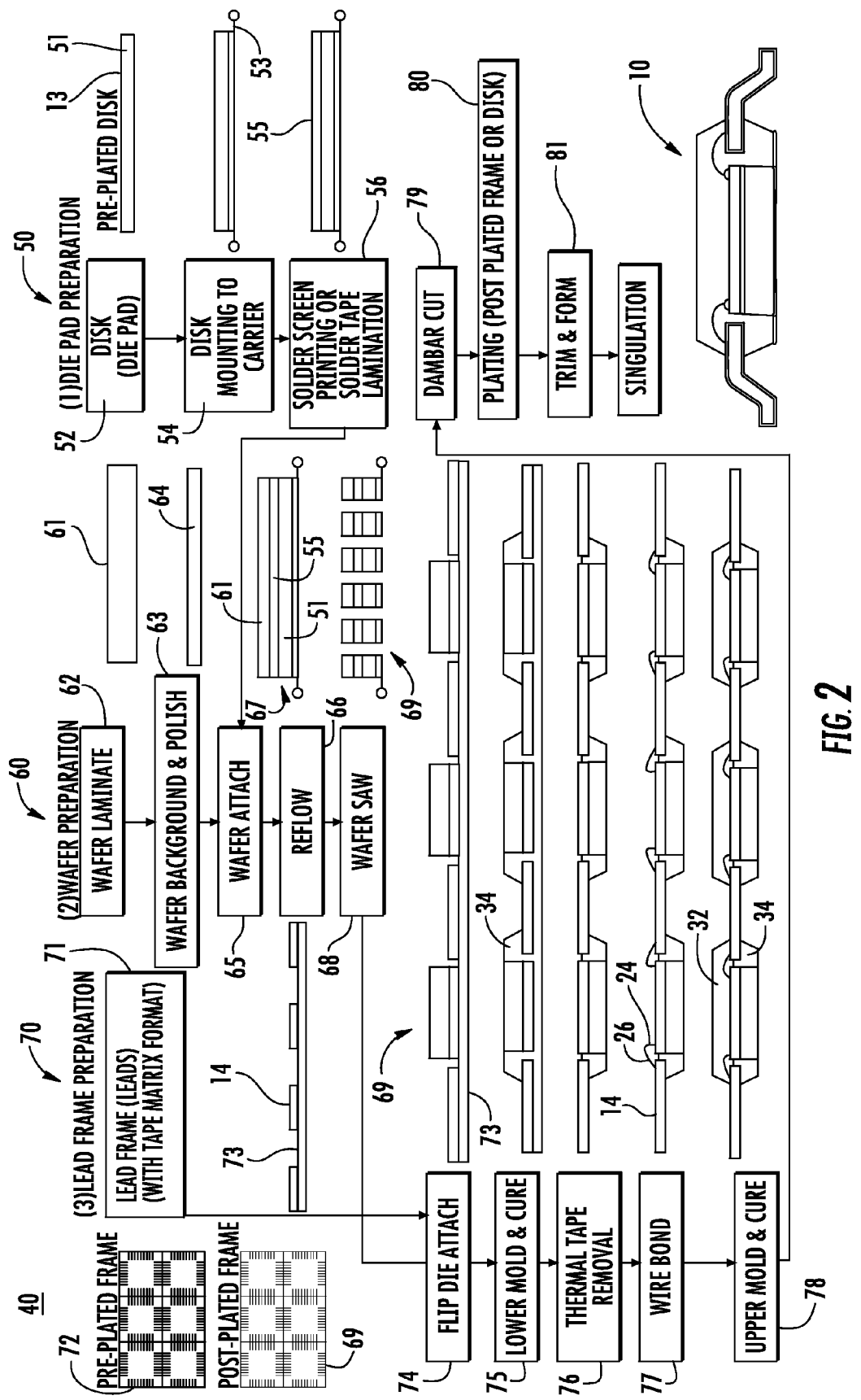
FIG. 2 is a process flow diagram for making the IC package illustrated in FIG. 1.

Referring now to FIG. 2, a process flow 40 for forming the IC package 10 will be discussed. The process flow 40 is divided into three sections: 1) a die pad preparation section 50, 2) a wafer preparation section 60, and 3) a lead frame preparation section 70. As the section names imply, the die pad preparation section 50 provides the die pad 12, the wafer preparation section 60 provides the IC die 22, and the lead frame preparation section 70 provides the lead frames (i.e., leads 14). Collectively the three sections 50, 60 and 70 merge into one another to produce a plurality of IC packages 10.

The die pad preparation section 50 starts off with a disk 51 at Block 52. The disk 51 includes a plurality of uncut die pads 12. The disk 51 may be a copper disk, for example. The illustrated disk has been pre-plated with a plating material 13, such as nickel, palladium and gold, for example. Alternatively, cut portions of the disk 51 may be post plated after the IC packages 10 have been produced. The disk 51 is mounted to a carrier 53 at Block 54. Solder screen printing or solder tape lamination 55 is applied to the exposed surface of the disk 51 at Block 56. As an alternative to solder screen printing, a tin-plated copper foil self conducted adhesive tape may be used.

Block 56 feeds into the wafer preparation section 60. In the wafer preparation section 60, a wafer 61 includes a plurality of uncut IC dies 12. The wafer 61 is laminated at Block 62. The wafer 61 is then back grinded and polished at Block 63 to produce a polished wafer 64. At Block 65, the disk 51 with solder tape lamination 55 at Block 56 is attached to the polished wafer 64 at Block 65. A solder reflow process is performed at Block 66 to produce a combined wafer and disk arrangement 67. At Block 68, a wafer saw is used to cut the combined wafer and disk arrangement 67 into separate die pad/IC die combinations 69.

In the lead frame preparation section 70, a matrix of lead frames 72 is provided at Block 71. The lead frames 72 include the leads 14 but do not include die pads between the leads. The illustrated matrix of lead frames 72 may be pre-plated with a plating material 15, such as nickel, palladium and gold, for example. Alternatively, the leads 14 may be post-plated after the IC packages 10 are formed. The illustrated matrix of lead frames without plating is referred to by reference 69. At Block 71, the matrix of lead frames 72 is positioned on thermal tape 73. In other words, the leads 14 are on the thermal tape 73.

At Block 74, the separate die pad/IC die combinations 69 are positioned on the thermal tape 73. Each separate die pad/IC die combination 69 is flipped so that the IC die 22 is in contact with the thermal tape 73.

As noted above, the encapsulating material body 30 comprises an upper body portion 32 comprising a first encapsulating material, and a lower body portion 34 comprising a second encapsulating material different than the first encapsulating material. At Block 75, a lower mold is used to mold the lower body portion 34 comprising the second encapsulating material. The lower body portion 34 is also cured. The thermal tape 73 is removed at Block 76. The intermediate IC package is flipped over at Block 77 so that wire bonds 26 are coupled between the pins 14 and the bond pads 24.

At Block 78, an upper mold is used to mold the upper body portion 32 comprising the first encapsulating material. The upper body portion 32 is also cured. A quality of the first encapsulating material is greater than a quality of the second encapsulating material. The risk of wire sweep for the bond wires 26 coupled between the bond pads 24 and the leads 14 is advantageously reduced by using the first encapsulating material with a greater quality of encapsulating material. An advantage of using the second encapsulating material with a lower quality of encapsulating material is that production costs may be further reduced.

The IC packages 10 may then be cut and separated from one another. The dambar is cut at Block 79. Post-plating of the leads 14 and the lower exposed surface of the die pad 12 is performed at Block 80 if pre-plating was not used as discussed above. A trim and form process step is performed at Block 81 to provide the individual IC packages 10.

Figure 3:
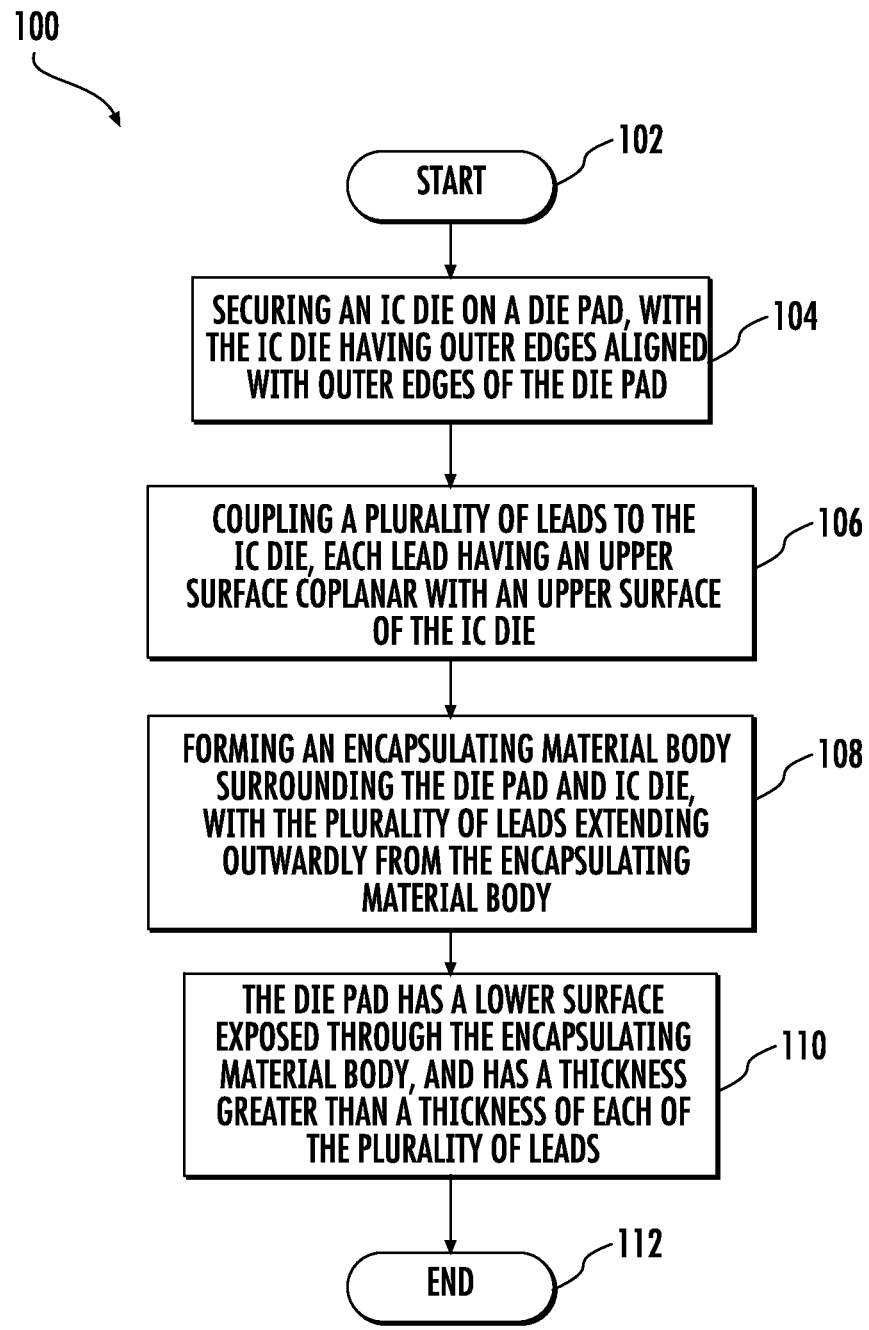
FIG. 3 is a flowchart illustrating a method for making the IC package illustrated in FIG. 1.

Referring now to the flowchart 100 illustrated in FIG. 3, a method for making an IC package 10 will be discussed. From the start (Block 102), the method comprises securing an IC die 22 on a die pad 12 at Block 104. The IC die 22 has outer edges aligned with outer edges of the die pad 12. A plurality of leads 26 are coupled to the IC die 22 at Block 106. Each lead 14 has an upper surface coplanar with an upper surface of the IC die 22. An encapsulating material body 30 is formed at Block 108 to surround the die pad 12 and IC die 22. The plurality of leads 14 extend outwardly from the encapsulating material body 30. At Block 110, the die pad 12 has a lower surface exposed through the encapsulating material body 30, and has a thickness greater than a thickness of each of the plurality of leads 14. The method ends at Block 112.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed:

1. An integrated circuit (IC) package comprising:
   a die pad having a rectangular shape with parallel sidewalls;
   an IC die secured on said die pad, with said IC die having a rectangular shape with parallel sidewalls aligned with the parallel sidewalls of said die pad;
   an encapsulating material body surrounding said die pad and IC die; and
   a plurality of leads extending outwardly from said encapsulating material body and coupled to said IC die, each lead having an upper surface being coplanar with an upper surface of said IC die;
   said die pad having a lower surface exposed through said encapsulating material body, and having a thickness greater than a thickness of each of said plurality of leads.

2. The IC package according to claim 1 wherein the thickness of said die pad is at least two times a thickness of each of said plurality of leads.

3. The IC package according to claim 1 wherein each lead also has a lower surface being coplanar with a lower surface of said die pad.

4. The IC package according to claim 1 wherein said encapsulating material body comprises:
   an upper body portion comprising a first encapsulating material; and
   a lower body portion comprising a second encapsulating material different than the first encapsulating material.

5. The IC package according to claim 4 wherein the first encapsulating material has a quality greater than a quality of the second encapsulating material.

6. The IC package according to claim 1 further comprising a plating material on at least one of external surfaces and internal surfaces of each lead of said plurality of leads.

7. The IC package according to claim 6 wherein said plating material comprises nickel, palladium and gold.

8. The IC package according to claim 1 further comprising a plating material on the exposed lower surface of said die pad.

9. The IC package according to claim 8 wherein said plating material comprises nickel, palladium and gold.

10. The IC package according to claim 1 wherein said IC die comprises a plurality of bond pads; and further comprising a respective bond wire coupling each of said plurality of leads to a corresponding bond pad of said plurality of bond pads.

11. The IC package according to claim 1 further comprising an adhesive layer securing said IC to said die pad.

12. An integrated circuit (IC) package comprising:
    a die pad having a rectangular shape with parallel sidewalls;
    an IC die secured on said die pad, with said IC die having a rectangular shape with parallel sidewalls aligned with the parallel sidewalls of said die pad;
    an encapsulating material body surrounding said die pad and IC die; and
    a plurality of leads extending outwardly from said encapsulating material body and coupled to said IC die, each lead having an upper surface being coplanar with an upper surface of said IC die;
    each lead of said plurality of leads having a lower surface being coplanar with a lower surface of said die pad;
    said die pad having a lower surface exposed through said encapsulating material body;
    said die pad having a thickness at least twice as great as a thickness of each of said plurality of leads.

13. The IC package according to claim 12 wherein said encapsulating material body comprises
    an upper body portion comprising a first encapsulating material; and
    a lower body portion comprising a second encapsulating material different than the first encapsulating material.

14. The IC package according to claim 13 wherein the first encapsulating material has a quality greater than a quality of the second encapsulating material.

15. The IC package according to claim 12 further comprising a plating material on at least one of external surfaces and internal surfaces of each lead of said plurality of leads.

16. The IC package according to claim 12 further comprising a plating material on the exposed lower surface of said die pad.

17. An integrated circuit (IC) package comprising:
    a die pad;
    an IC die secured on said die pad, with outermost sidewalls of said IC die being aligned with outermost sidewalls of said die pad;
    an encapsulating material body surrounding said die pad and IC die, said encapsulating material body comprising
       an upper body portion comprising a first encapsulating material, and
       a lower body portion comprising a second encapsulating material different than the first encapsulating material; and a plurality of leads extending outwardly from said encapsulating material body and coupled to said IC die, each lead having an upper surface being coplanar with an upper surface of said IC die;

said die pad having a lower surface exposed through said encapsulating material body, and having a thickness greater than a thickness of each of said plurality of leads.

18. The IC package according to claim 17 wherein the thickness of said die pad is at least two times a thickness of each of said plurality of leads.

19. The IC package according to claim 17 wherein each lead also has a lower surface being coplanar with a lower surface of said die pad.

20. The IC package according to claim 17 wherein the first encapsulating material has a quality greater than a quality of the second encapsulating material.

21. The IC package according to claim 17 further comprising a plating material on at least one of external surfaces and internal surfaces of each lead of said plurality of leads.

22. The IC package according to claim 17 further comprising a plating material on the exposed lower surface of said die pad.

23. The IC package according to claim 17 wherein said IC die comprises a plurality of bond pads; and further comprising a respective bond wire coupling each of said plurality of leads to a corresponding bond pad of said plurality of bond pads.

24. The IC package according to claim 17 further comprising an adhesive layer securing said IC to said die pad.

* * * * *